US010663514B2

(12) United States Patent
Gossett et al.

(10) Patent No.: US 10,663,514 B2
(45) Date of Patent: May 26, 2020

(54) VIRTUAL PROBE SEQUENCING

(71) Applicant: Artisan Electronics, Inc., Odon, IN (US)

(72) Inventors: Greg Gossett, Bloomington, IN (US); Thomas Barclay, Bloomington, IN (US); Carrol Wade Poff, Oak Grove, MO (US)

(73) Assignee: Artisan Electronics, Inc., Odon, IN (US)

( * ) Notice: Subject to any disclaimer, the term of this patent is extended or adjusted under 35 U.S.C. 154(b) by 99 days.

(21) Appl. No.: 15/959,895

(22) Filed: Apr. 23, 2018

(65) Prior Publication Data
US 2018/0321316 A1 Nov. 8, 2018

Related U.S. Application Data

(60) Provisional application No. 62/602,714, filed on May 4, 2017.

(51) Int. Cl.
*G01R 31/3185* (2006.01)
*G01R 31/327* (2006.01)
*G01R 31/319* (2006.01)

(52) U.S. Cl.
CPC ........... *G01R 31/318597* (2013.01); *G01R 31/318555* (2013.01); *G01R 31/318583* (2013.01); *G01R 31/318594* (2013.01); *G01R 31/31919* (2013.01)

(58) Field of Classification Search
CPC .... G01R 31/318597; G01R 31/318555; G01R 31/318583; G01R 31/318594; G01R 31/31919
See application file for complete search history.

(56) References Cited

U.S. PATENT DOCUMENTS

| 4,825,416 A | * | 4/1989 | Tam ..................... G11C 7/1039 365/189.02 |
| 5,434,804 A | | 7/1995 | Bock et al. |
| 5,446,650 A | * | 8/1995 | Overhage ............ G01R 13/345 324/121 R |

(Continued)

FOREIGN PATENT DOCUMENTS

CN         203275482         11/2013

OTHER PUBLICATIONS

Lofstrom, Early capture for boundary scan timing measurements, IEEE, Conference paper, pp. 417-422 (Year: 1996).*

(Continued)

*Primary Examiner* — April Y Blair
*Assistant Examiner* — Dipakkumar B Gandhi
(74) *Attorney, Agent, or Firm* — Liell & McNeil

(57) ABSTRACT

An internal net of a digital circuit is virtually probed while performing a dynamic functional stimulation that includes changing vectors asserted to a dynamic functional interface. A JTAG SAMPLE command is triggered through a JTAG interface at a timing during the dynamic functional stimulation by controlling the timing of a JTAG TCK rising clock edge. Captured JTAG SAMPLE data is shifted out to the JTAG interface. The JTAG SAMPLE data, which includes the logic states of internal nets at a chosen timing during the dynamic functional stimulation, are stored. A sequence database is built by repeating the test with incrementally different JTAG rising clock edge timings.

11 Claims, 8 Drawing Sheets

(56) References Cited

U.S. PATENT DOCUMENTS

| | | | |
|---|---|---|---|
| 6,467,009 B1* | 10/2002 | Winegarden | G06F 13/4217 |
| | | | 710/305 |
| 7,908,532 B2 | 3/2011 | Eckelman et al. | |
| 7,930,604 B1 | 4/2011 | Azimi et al. | |
| 8,633,725 B2 | 1/2014 | Gorti et al. | |
| 8,829,934 B2 | 9/2014 | Sellathamby et al. | |
| 9,513,334 B2 | 12/2016 | Shanker et al. | |
| 9,817,066 B1* | 11/2017 | Kuramoto | G01R 31/318594 |
| 2003/0126524 A1* | 7/2003 | Kashihara | G01R 31/318541 |
| | | | 714/718 |
| 2003/0164718 A1* | 9/2003 | Emberling | G01R 31/31705 |
| | | | 326/16 |
| 2006/0236174 A1* | 10/2006 | Whetsel | G01R 31/3172 |
| | | | 714/724 |
| 2007/0011522 A1* | 1/2007 | Denniston | G01R 31/318314 |
| | | | 714/724 |
| 2008/0082879 A1* | 4/2008 | Guettaf | G01R 31/318536 |
| | | | 714/727 |
| 2009/0157761 A1* | 6/2009 | Yanagida | G06F 11/267 |
| 2009/0249143 A1* | 10/2009 | Iwami | G01R 31/318555 |
| | | | 714/726 |
| 2012/0102375 A1* | 4/2012 | Whetsel | G01R 31/318555 |
| | | | 714/727 |

OTHER PUBLICATIONS

Gian Luca Pizzocolo and Dr. Bob Storey, Combining JTAG Boundary Scan With Functional Testing, T&M Supplement, Aug. 1, 2014, pp. 26-28, www.electronicsworld.co.uk, Published in the United Kingdom.

* cited by examiner

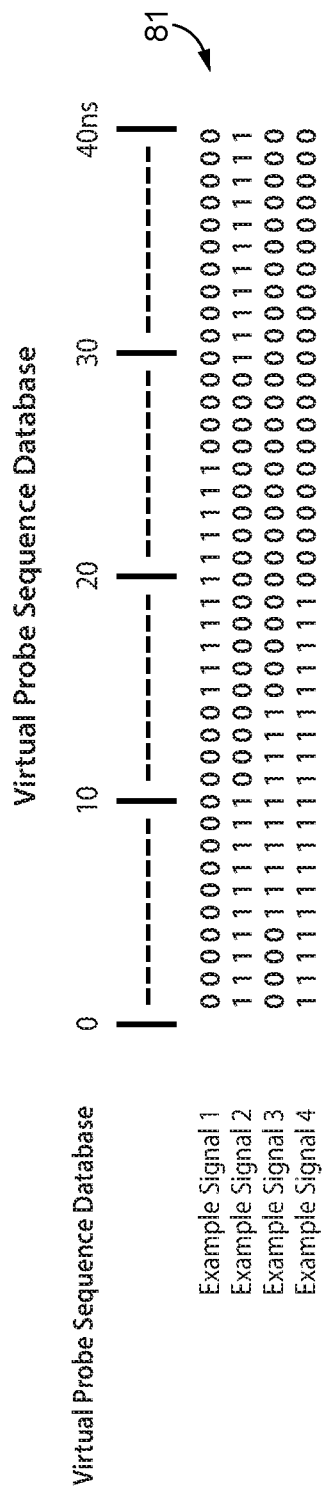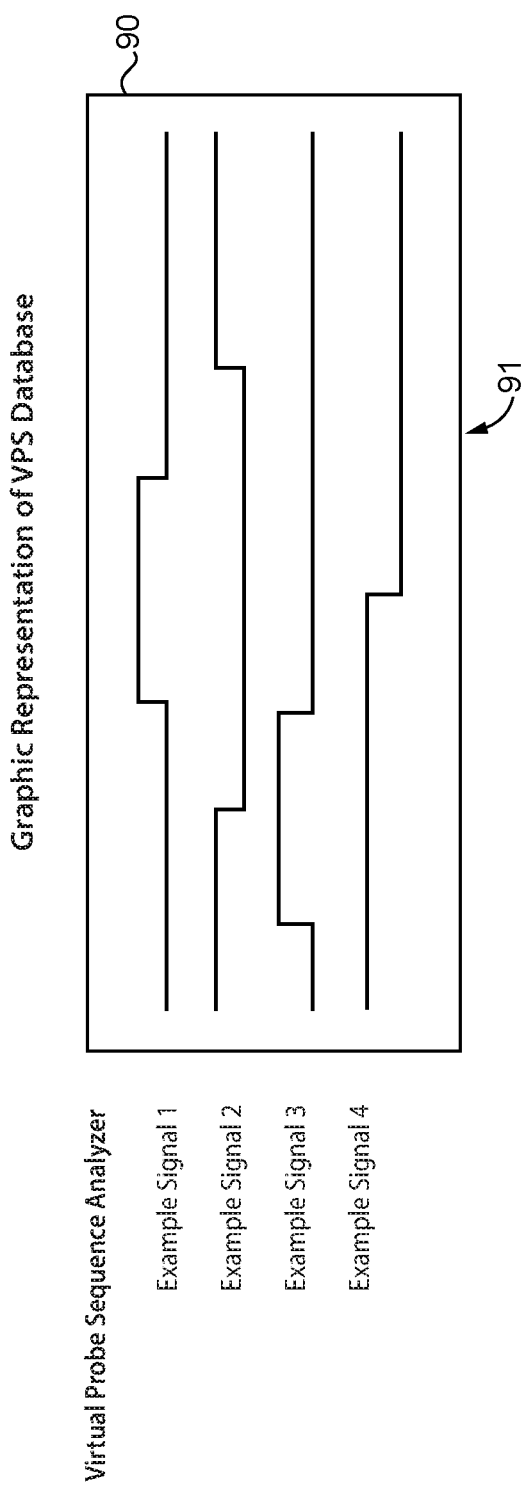

VIRTUAL PROBE SEQUENCING

TECHNICAL FIELD

The present disclosure relates generally to probing digital circuits that include at least one IEEE1149.1 JTAG device, and more particularly to controlling a JTAG TCK rising clock edge timing to facilitate a JTAG boundary scan SAMPLE instruction during dynamic functional stimulus to the digital circuit.

BACKGROUND

This disclosure assumes some familiarity with IEEE1149.1 and the standard JTAG specification which is taught elsewhere and will not be repeated here. As electronic circuit cards and assemblies of circuit cards become more complex, with increasing density and the continued trends toward miniaturization, physical access to internal nets on these circuit cards becomes more difficult each passing year. Traditionally, physically probing internal nets with an oscilloscope probe, logic analyzer probe, or a guided probe has been an effective method to provide diagnostic fault isolation of failed circuit cards, or to support debugging code during test development or to probe a properly functioning circuit card. With the advent of FPGA devices commonly having 500+ pins with a 0.02 inch spacing, and 32 or 64-bit data bus architecture as common place, or even worse, ball grid arrays (BGA) without any physical access, physically probing circuit cards and assemblies has become problematic. Probing a circuit card generally relates to acquiring logic states and logic state transition timings on internal nets that are difficult or impossible to physically probe, especially while the circuit card is performing responsive to dynamic functional stimulation.

The present disclosure is directed toward one or more of the problems set forth above.

SUMMARY

In one aspect, a digital circuit electronic system includes a unit under test that includes a digital circuit with at least one JTAG device in communication with a JTAG interface, and includes a dynamic functional interface. The JTAG device includes a plurality of pins to be virtually probed. At least one piece of electronic equipment is in communication with the JTAG interface and the dynamic functional interface. The electronic equipment has a JTAG algorithm, a dynamic functional stimulus algorithm, a synchronizing algorithm and a virtual probe data algorithm. The dynamic functional stimulus algorithm is configured to communicate a plurality of vectors to the dynamic functional interface that change during a dynamic functional stimulation. The synchronizing algorithm is configured to trigger a JTAG SAMPLE command to the JTAG interface at a timing during the dynamic functional stimulation by controlling a timing of a JTAG TCK rising clock edge. JTAG SAMPLE data is captured responsive to the JTAG SAMPLE command. The virtual probe data algorithm is configured to shift out the captured JTAG SAMPLE data to the JTAG interface, and store the JTAG SAMPLE data, which includes logic states of the pins at the timing during the dynamic functional stimulation.

In another aspect, a method of virtually probing a unit under test includes performing a dynamic functional stimulation by asserting a plurality of vectors that change during the dynamic functional stimulation to the dynamic functional interface of the unit under test. A JTAG SAMPLE command is triggered through the JTAG interface at a timing during the dynamic functional stimulation by controlling the timing of a JTAG TCK rising clock edge. JTAG SAMPLE data is captured responsive to the JTAG SAMPLE command. The captured JTAG SAMPLE data is shifted out to the JTAG interface and is stored. The JTAG SAMPLE data includes logic states of virtually probed pins of the JTAG device at the timing during the dynamic functional stimulation.

BRIEF DESCRIPTION OF THE DRAWINGS

FIG. 9 is a pictorial representation of a sequence database for four JTAG virtually probed pins of interest for a dynamic functional stimulation having a 40 nanosecond duration with logic states captured at one nanosecond increments; and FIG. 10 is a schematic view of a display presenting logic state data of the virtually probed pins in a logic analyzer format according to the present disclosure.

DETAILED DESCRIPTION

Figure 1:
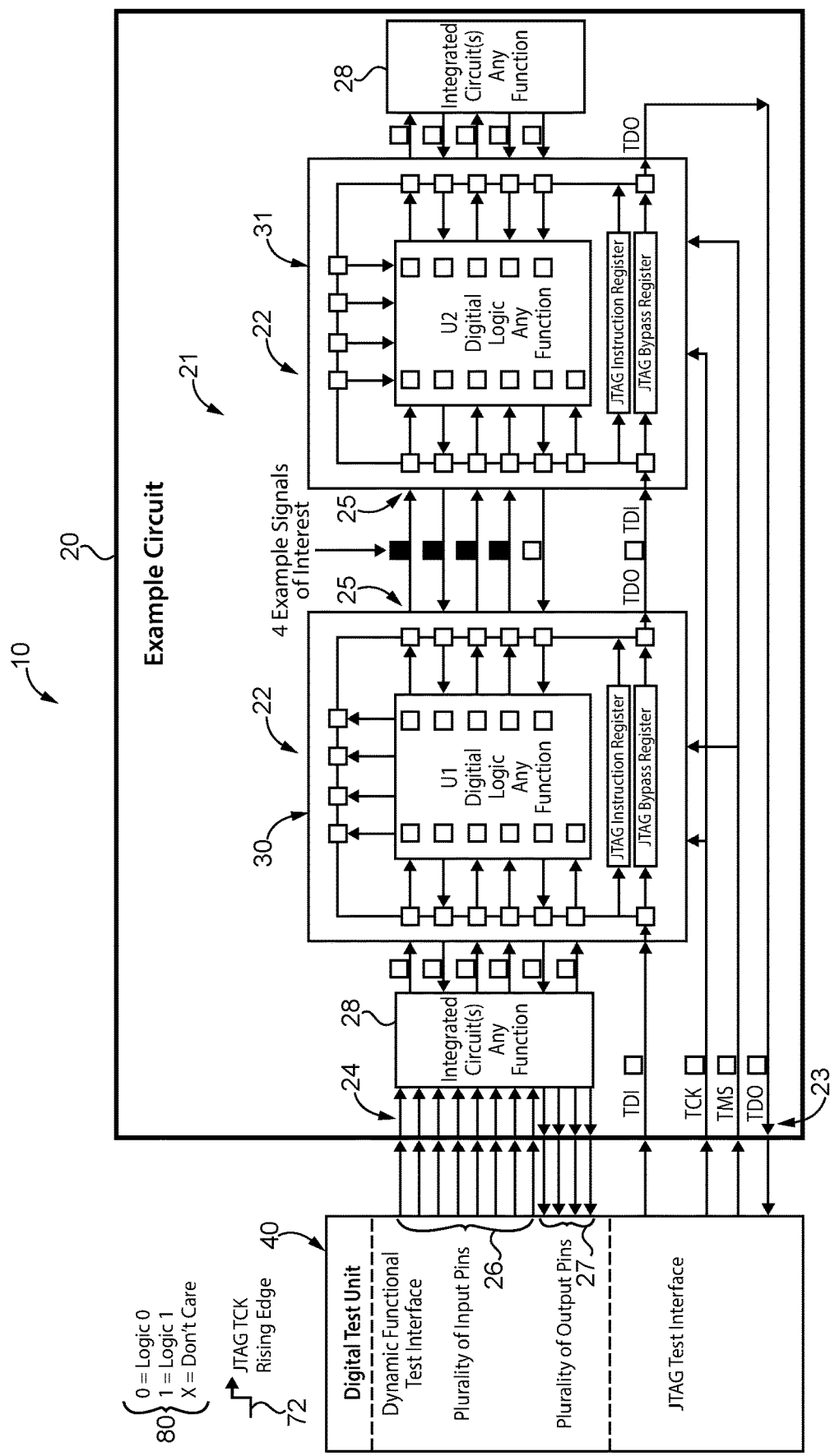
FIG. 1 is a schematic illustration of a digital circuit electronic system according to the present disclosure.

Referring initially to FIG. 1, a digital circuit electronic system 10 according to one example embodiment is illustrated. System 10 includes a unit under test 20 that includes a digital circuit 21 with at least one JTAG device 22 in communication with a JTAG interface 23. The JTAG device(s) 22 includes a plurality of pins associated with boundary scan registers of the JTAG device(s) 22. For purposes of illustrating the concept of the present disclosure, four example pins of interest 25 of the plurality of pins associated with the two JTAG devices 22 are identified for virtual probing according to the present disclosure. Although the present illustration shows a digital circuit 21 with two JTAG devices 22, those skilled in the art will appreciate that digital circuits with one, or more than two JTAG devices, would also fall within the scope of the present disclosure. In addition, some digital circuits may include more than one JTAG interface associated with one or more JTAG devices, which also falls within the scope of the present disclosure. The JTAG device pins 25 to be virtually probed according to the description infra represent pins that may have some practical difficulty being physically probed, but the present disclosure also encompasses digital circuits with easily physically probed internal nets (pins). The JTAG interface 23 should be recognizable by its four standard ports: test data input (TDI), test clock input (TCK), test mode select (TMS) and test data output (TDO). The unit under test 20 also includes a dynamic functional interface 24 that includes a plurality of input pins 26 and a plurality of output pins 27. Although the illustration shows eight input pins 26 and four output pins 27, those skilled in the art will appreciate that the present disclosure contemplates any number of input pins combined with any number of output pins. In addition to a first JTAG device 22 which may be a field programmable gate array (FPGA) device 30 and a second JTAG device 22 that could be a ball grid array (BGA) 31, the digital circuit 21 could include any other electronic components known to those in the art, including but not limited to one or more integrated circuits 28.

At least one piece of electronic equipment 40 is in communication with the JTAG interface 23 and the dynamic functional interface 24. Electronic equipment 40 is illustrated as a single box, but could be separate computer controlled components, including a situation where the unit under test 20 remains installed in its native larger device while the JTAG interface 23 is still accessible. Nevertheless, one example system 10 could be a digital test unit appropriately programmed to emulate a JTAG controller and provide actual or simulated dynamic functional vectors to the dynamic functional interface 24. The electronic equipment 40 may also collect dynamic functional outputs at output pins 27 for typical purposes, such as confirming other functional aspects of the unit under test 20. Electronic equipment 40 includes a JTAG algorithm configured to communicate a JTAG SAMPLE command to the JTAG interface, and shift out captured JTAG SAMPLE data to the JTAG interface. Electronic equipment 40 also includes a dynamic functional stimulus algorithm configured to communicate a plurality of vectors to the dynamic functional interface 24, with the vectors changing during a dynamic functional stimulation, which may be a fixed duration dynamic functional test. Electronic equipment 40 also includes a synchronizing algorithm configured to trigger the JTAG SAMPLE command at a timing during the dynamic functional stimulation by controlling a timing of a JTAG TCK rising clock edge 72. JTAG SAMPLE data is captured responsive to the JTAG SAMPLE command. A virtual probe data algorithm is configured to shift out the captured JTAG SAMPLE data to the JTAG interface, and store the JTAG SAMPLE data, which includes logic states of the JTAG device pins at the selected timing during the dynamic functional stimulation. Thus, at its core, the present disclosure teaches synchronization of a JTAG TCK rising clock edge to execute a JTAG SAMPLE command while the digital circuit 21 is being dynamically stimulated to capture logic states associated with pins of the JTAG device(s) 22 at a selected timing during the dynamic functional stimulation. This process may then be repeated with the JTAG SAMPLE command executed at different timings to assemble a sequence database that includes the logic states of the JTAG device(s) 22 pins at a sequence of timings during the dynamic functional stimulation.

Figure 2:
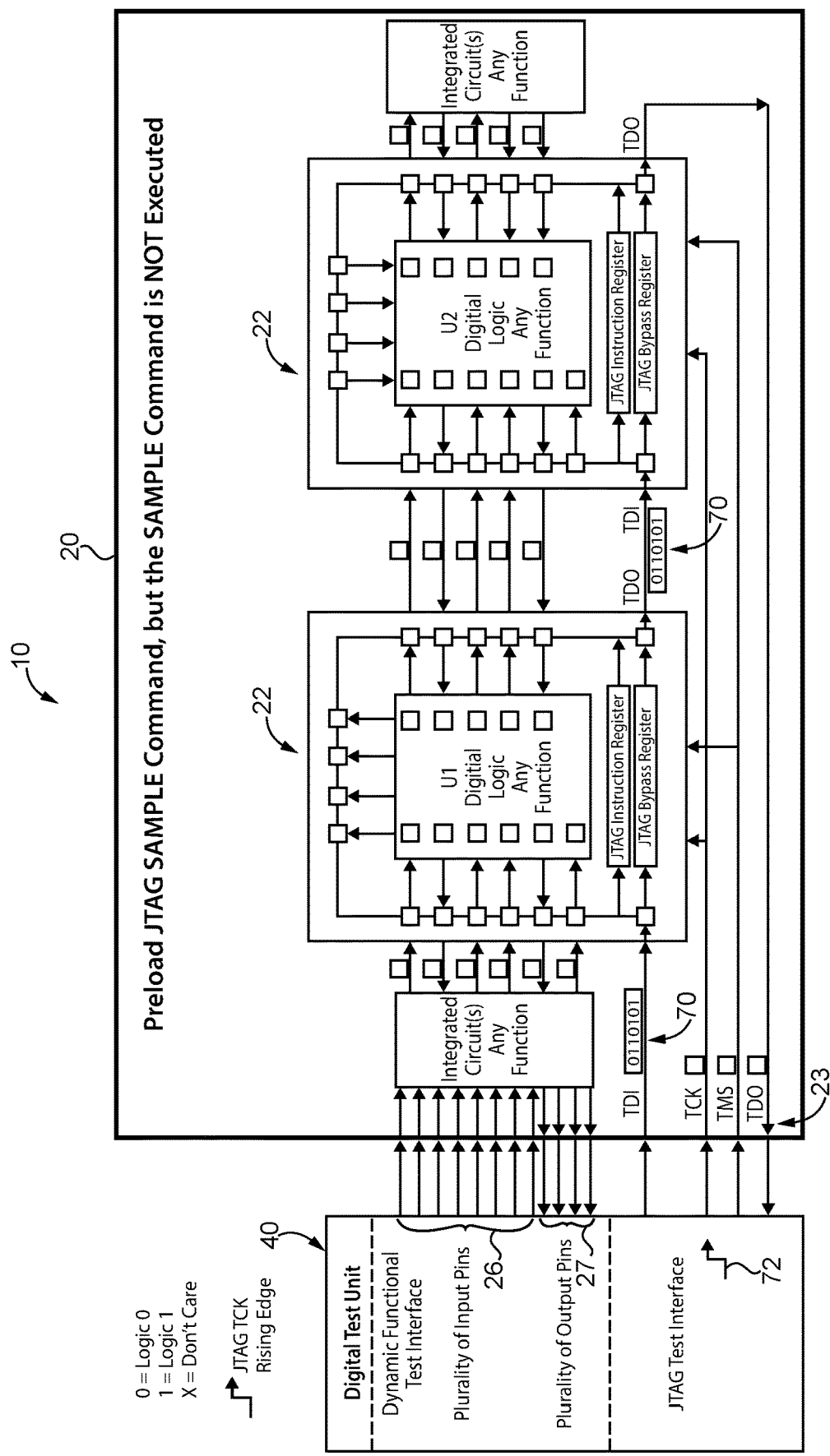
FIG. 2 shows the system of FIG. 1 while a JTAG SAMPLE command is preloaded at a JTAG interface, but the sample command is not executed.

Referring now to FIG. 2, the process according to the present disclosure may begin by programming the JTAG device(s) 22 through the TDI port of the JTAG interface to perform a JTAG SAMPLE command 70 prior to initiating a dynamic functional stimulation. Those skilled in the art will appreciate that, although the JTAG SAMPLE command 70 can be pre-loaded in the JTAG instruction register, the command is not executed until a rising clock edge appears at the TCK port of the JTAG interface 23. One of the reasons that the present disclosure teaches pre-loading the JTAG SAMPLE command 70 is because this process takes some finite amount of time, which may vary and be uncertain. However, presenting a TCK rising clock edge to trigger execution of the JTAG SAMPLE command 70 can have a tightly controlled and known timing. Thus, before a dynamic functional stimulation is even initiated, the JTAG device(s) 22 is ready to execute a JTAG SAMPLE command 70 at the precise moment when the JTAG TCK rising clock edge is asserted at a precise timing during a forthcoming dynamic functional stimulation. The pre-loading of the JTAG SAMPLE command 70 might be eliminated if it were practical to determine a time delay from when a JTAG SAMPLE command was initiated to when it were actually executed, as per conventional JTAG boundary scans during static tests, so that one could determine the precise timing at which the JTAG SAMPLE command 70 were executed. In addition, even if it were not practical to predict the precise timing of a JTAG SAMPLE command execution if done in a conventional manner without controlling a timing of the TCK rising clock edge, it might be possible to retroactively determine when the JTAG SAMPLE command was executed. In such a case, the precise timing of the execution of the JTAG SAMPLE command would still be known, and thus the captured JTAG SAMPLE data would include logic states of pins for the JTAG device 22 at the known execution timing.

Figure 3:
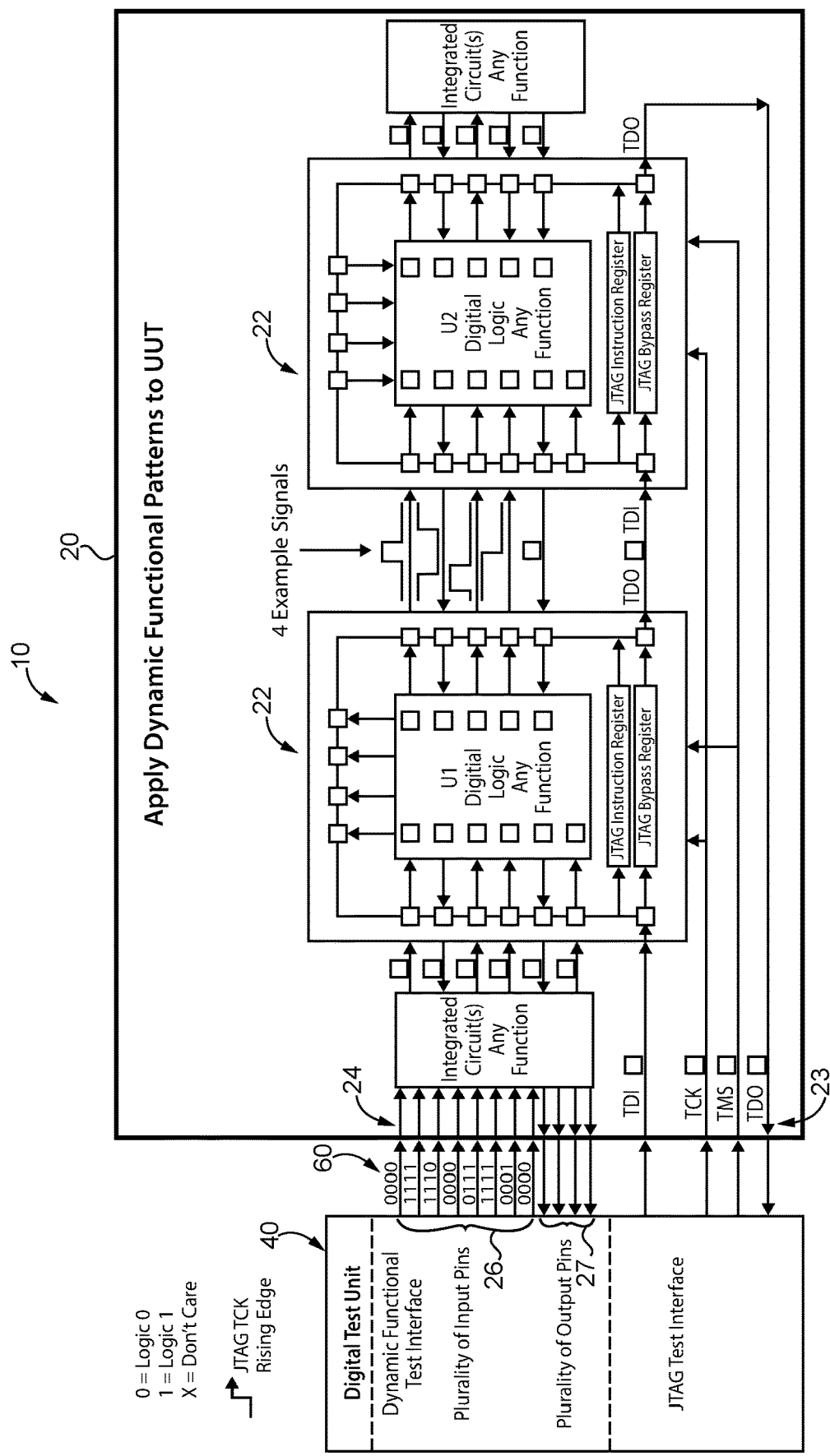
FIG. 3 shows the system of FIGS. 1 and 2 while applying dynamic functional vectors to the dynamic functional interface during a dynamic functional stimulation.
Figure 7:
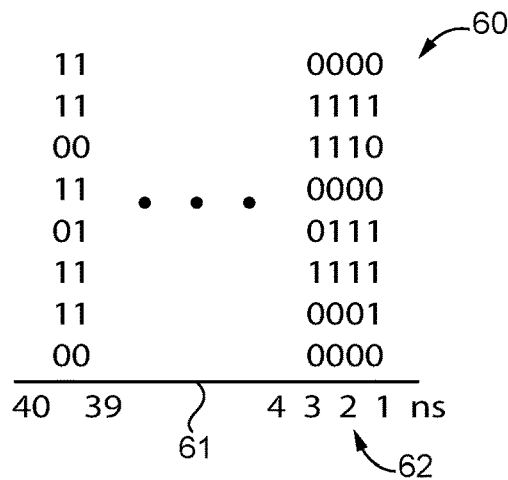
FIG. 7 is an example set of dynamic functional stimulus vectors for a dynamic functional stimulation of the system of FIGS. 1-5.

Referring now to FIG. 3, after the JTAG SAMPLE command has been preloaded but not executed, a dynamic functional stimulus algorithm is configured to communicate a plurality of vectors 60 to the dynamic functional interface 24. The first of the vectors 60 marks the beginning of a dynamic functional stimulation, and the last of the plurality of vectors 60 marks the end of a dynamic functional stimulation. In this specific example dynamic functional test, a new vector is asserted at the dynamic functional interface each one nanosecond. A plurality of vectors 60 change during the dynamic functional stimulation. Referring briefly to FIG. 7, the plurality of vectors 60, the dynamic functional stimulation 61 of this example includes forty vectors asserted at the dynamic functional interface 24 at one nanosecond increments, yielding a dynamic functional test with a duration of 40 nanoseconds.

Figure 4:
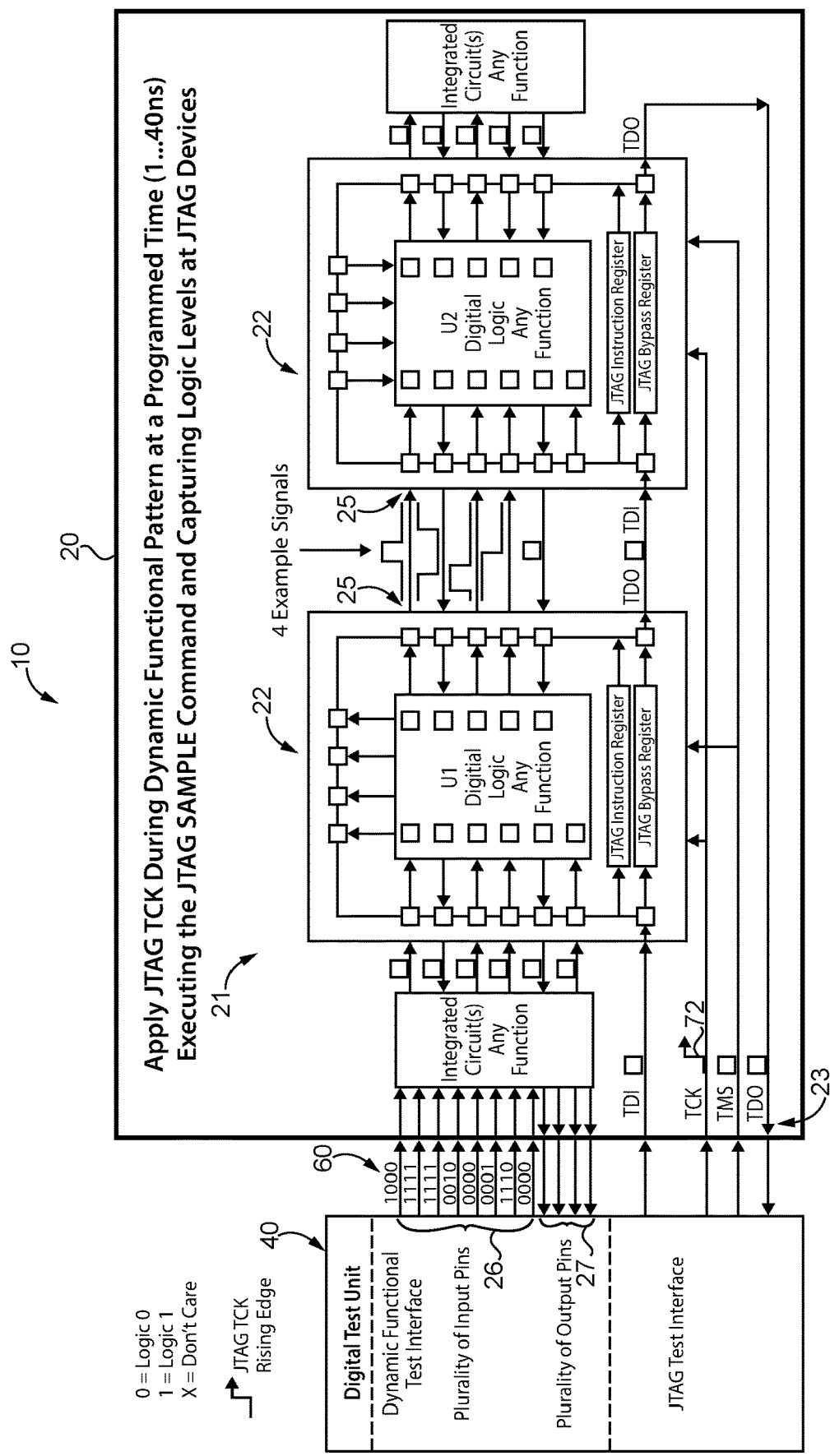
FIG. 4 shows the system of FIGS. 1-3 triggering execution of the JTAG SAMPLE command by applying a JTAG TCK rising clock edge during the dynamic functional stimulation at a programmed timing.

Referring now to FIG. 4, at some timing during the dynamic functional stimulation 61, a synchronizing algorithm of the electronic equipment 40 triggers execution of JTAG SAMPLE command by controlling a timing of a JTAG TCK rising clock edge 72, causing JTAG SAMPLE data to be captured in the boundary scan registers associated with the JTAG device(s) 22. In the present example, four of these boundary scan register pins 25 are of interest as to what their logic states are at the timing at which the JTAG TCK rising clock edge 72 is asserted at the JTAG interface 23. Preferably, this timing is a predetermined timing that is determined prior to initiation of the dynamic functional stimulation. However, any method of arriving at that timing, including randomly, would also fall within the intended scope of the present disclosure, provided that the timing of the TCK rising clock edge can be determined after the JTAG SAMPLE data has been captured. Those skilled in the art recognize that some actions via the JTAG interface, such as the JTAG SAMPLE command, are independent from, and have no influence on, the functioning of the digital circuit 21 due to the dynamic functional stimulus as per the plurality of vectors 60 during the dynamic functional stimulation 61. Another action, such as a JTAG EXTEST command, can influence the functioning of the digital circuit.

Figure 5:
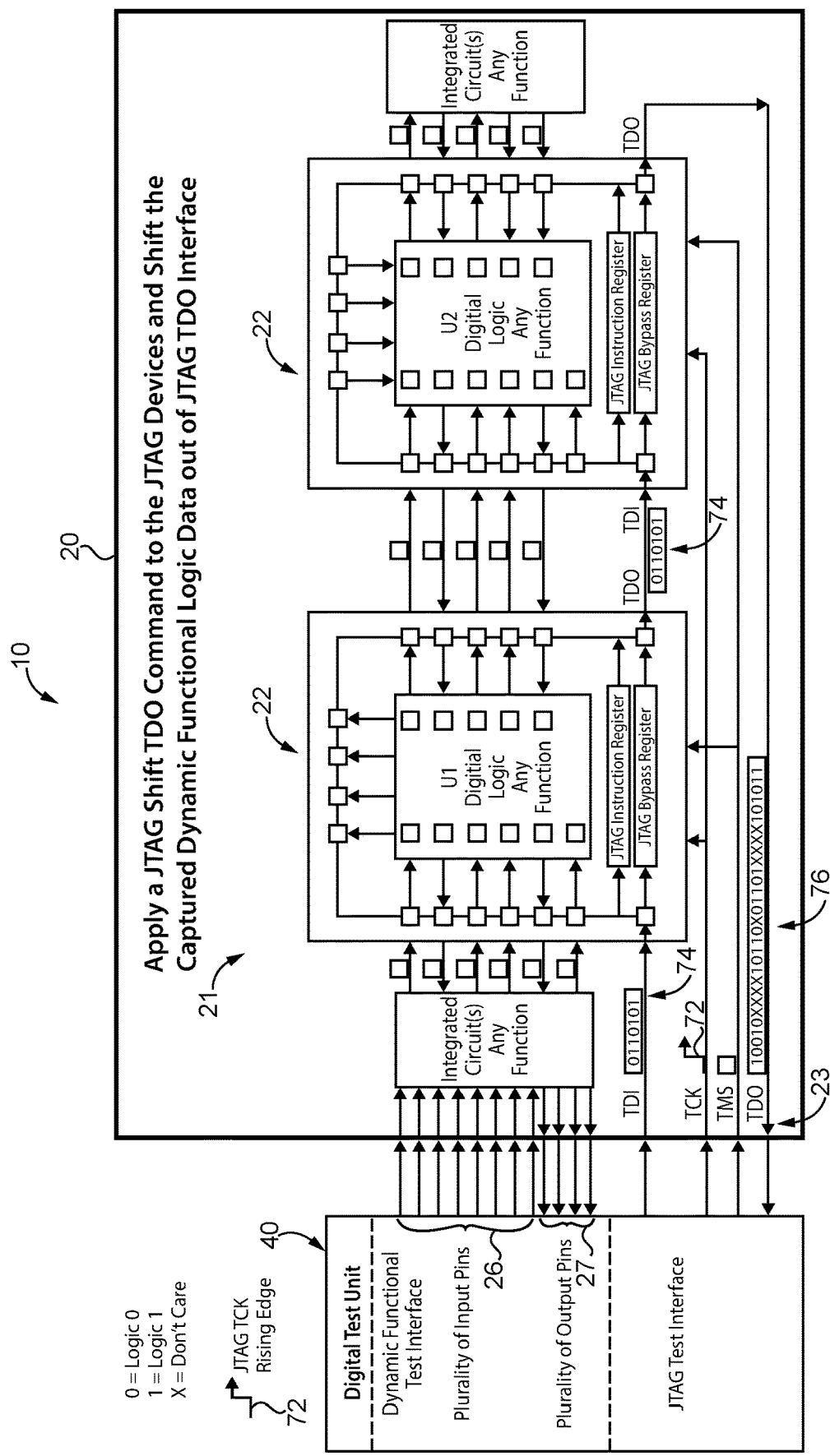
FIG. 5 shows the system of FIGS. 1-4 where a JTAG shift TDO command is performed after the dynamic functional stimulation to shift out the captured logic data to the JTAG interface.

Referring now to FIG. 5, sometime after assertion of the TCK rising clock edge 72 at the JTAG interface 23, it is desirable to shift out the captured JTAG SAMPLE data 76 out of the TDO port of the JTAG interface 23. Although the shifting out of the JTAG SAMPLE data could conceivable be performed while a dynamic functional stimulation is still being performed, in the present example the JTAG shift out command 74 may be initiated at another TCK rising clock edge 72, preferably after the current dynamic functional stimulation 61 is completed. The shifted out JTAG SAMPLE data 76 may then be stored by the electronic equipment. Those skilled in the art will appreciate that the JTAG SAMPLE data includes logic states of JTAG device pins, including the pins of interest 25, at the timing at which the JTAG SAMPLE command was executed.

The testing equipment 40 may also include a sequencing algorithm configured to repeat the dynamic functional stimulation a plurality of times, and change the timing at which the JTAG SAMPLE command is executed each time the dynamic functional stimulation is repeated. The virtual probe data algorithm is configured to assemble a sequence database that includes a sequence of the logic states for the pins of the JTAG device 22 at a sequence of timings during the dynamic functional stimulation. For instance, in the case of the presently illustrated example, the dynamic functional stimulation may be repeated forty times. Each time the dynamic functional stimulation is performed, the JTAG SAMPLE command is executed at a different timing. For instance, the first time through the test the JTAG SAMPLE command may be executed at the 1 nanosecond mark, second test capturing JTAG SAMPLE data at 2 nanoseconds and so on. The sequencing algorithm then can assemble a sequence database that includes the logic states of the JTAG device pins at 1 nanosecond increments throughout the full 40 nanosecond duration of the dynamic functional test. To confirm that the captured data is good, the dynamic functional stimulation may be repeated a plurality of times with the JTAG SAMPLE command being triggered at the same timing to confirm identical results. In addition, each time the dynamic functional stimulation is performed, the data at the output pins 27 can be stored and compared with subsequent runs of the dynamic functional stimulation to confirm that the outputs are consistent with each run of the dynamic functional stimulation.

Figure 6:
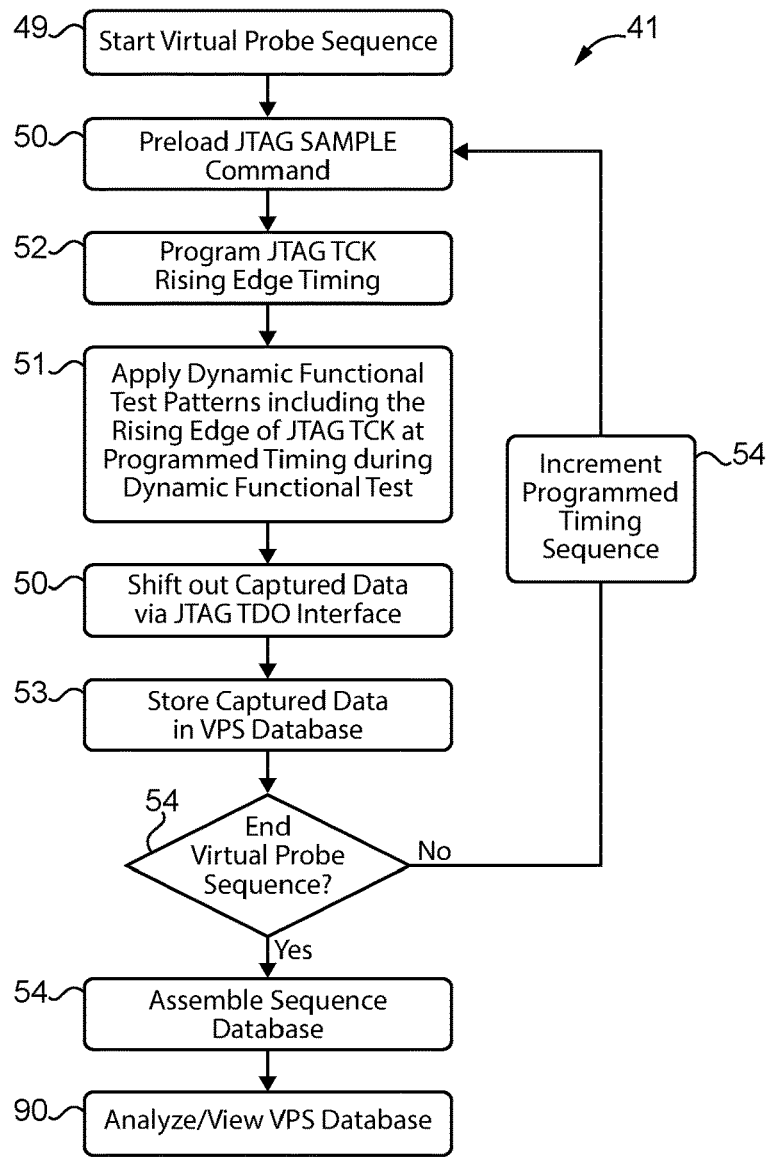
FIG. 6 is a logic flow diagram for performing a method of the present disclosure.

Referring now to FIG. 6, a logic flow diagram 41 reflects the various algorithms used to virtually probe a digital circuit according to the present disclosure. After a start 49 of the process, a JTAG algorithm 50 preloads the JTAG SAMPLE command via the JTAG interface as per FIG. 2. The JTAG algorithm 50 according to the present disclosure could include the ability to fully emulate a JTAG controller, or might have a lesser capability. For instance, the present disclosure teaches a strategy in which the JTAG SAMPLE command is preloaded and then executed with a precisely timed JTAG TCK rising clock edge, and have the ability to emulate a JTAG shift out command in order to retrieve the captured JTAG SAMPLE data. At the next block, a synchronizing algorithm 52 sets the timing at which the JTAG TCK rising clock edge will be asserted during a forthcoming dynamic functional stimulation. At this point in the logic, the JTAG SAMPLE command has been preloaded, and the timing at which the JTAG SAMPLE command will be executed during the forthcoming dynamic functional stimulation has been determined. Next, the dynamic functional stimulus algorithm 51 performs the dynamic functional stimulation, with the JTAG SAMPLE command being executed at some timing during the dynamic functional stimulation as per the timing determined by the synchronizing algorithm 52. Next, the JTAG algorithm 50 shifts out the captured JTAG SAMPLE data for storage as per FIG. 5. The virtual probe data algorithm 53 stores the captured sample data in a database for later review and analysis. At query 54, the logic determines whether the dynamic functional stimulation should be repeated for the same or different JTAG SAMPLE command execution. If so, a sequencing algorithm 54 increments or retains the programmed timing for execution of the next JTAG SAMPLE command. Thereafter, the process returns back to preloading the JTAG SAMPLE command and the other steps previously described. If the query 54 determines that the desired data has been captured and stored, the logic proceeds to the sequencing algorithm 54 to assemble a sequence database from the JTAG SAMPLE data captured at different timings during the dynamic functional stimulation to create a sequence of logic states at the sequence of timings during the dynamic functional stimulation. Next, when it comes time to review the results, a display algorithm 90 may be configured to display the selected portions of the sequence database, such as in a logic analyzer format known to those skilled in the art.

INDUSTRIAL APPLICABILITY

The present disclosure finds general applicability to probing internal nets of digital circuits that include at least one JTAG device. The present disclosure finds specific application to capturing logic states of internal nets of digital circuits at a chosen time during a dynamic functional stimulus, which may be actual or simulated test stimulus. Finally, the present disclosure finds general applicability as a strategy to create a time sequence of logic states of internal nets on a digital circuit during dynamic functional stimulation of the digital circuit, to, among other things, identify the precise timing at which logic state transitions occur on internal nets. The ability to virtually probe a digital circuit in a manner described above can be used to set standards for a properly functioning digital circuit, used in de-bugging a digital circuit, or possibly for diagnosing a digital circuit considered to be malfunctioning, or any other reason that might occur to a person of ordinary skill in the art.

Figure 8:
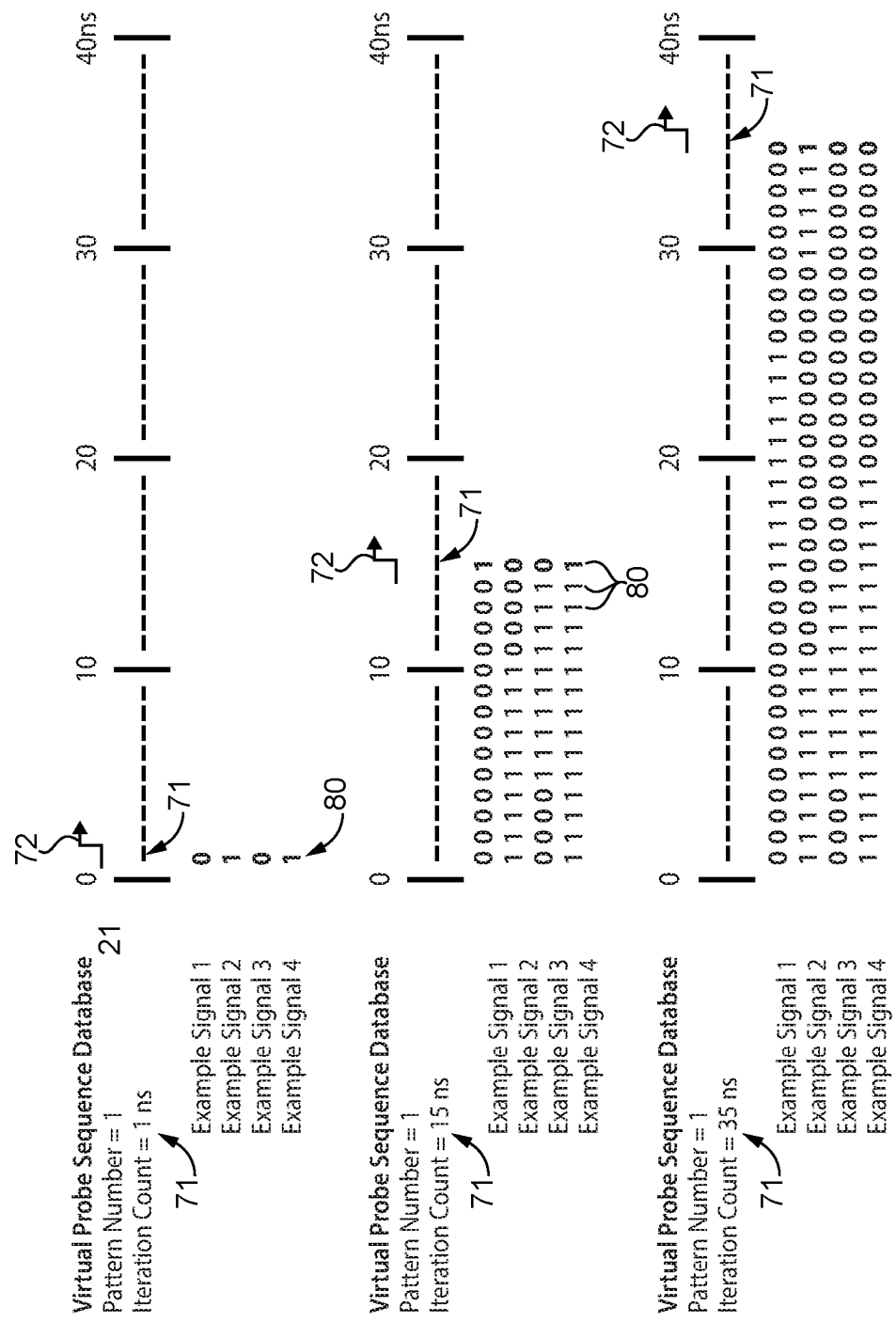
FIG. 8 is a pictorial illustration showing the assemblage of a sequence database of JTAG virtually probed pins through repetition of the dynamic functional stimulation.

Referring now in addition to FIGS. 8-10, the process of creating a sequencing database 81 according to the present disclosure is illustrated. In the top of FIG. 8, the logic states of the four logic state pins 25 of interest are captured by asserting the JTAG TCK rising clock edge at 1 nanosecond. The process is then completed to re-perform the dynamic functional stimulation with capturing the JTAG SAMPLE data and logic states at pins 25 at 2 nanoseconds, 3 nanoseconds and so on. The middle picture in FIG. 8 shows the data being captured at the 15 nanosecond timing during the 40 nanosecond duration of the dynamic functional stimulation by again asserting the JTAG TCK rising clock edge at 15 nanoseconds. The last portion in FIG. 8 shows the logic states being captured by asserting the JTAG TCK rising clock edge 72 at 35 nanoseconds. Eventually, as shown in FIG. 9 a complete sequence database 81 showing the logic states at each of the four pins 25 of interest. FIG. 10 schematically shows the sequence database 81 being displayed on a display 90 utilizing a known logic analyzer format 91 so that a technician can observe logic states and logic state transition timings for each of the four pins 25 of interest over the 40 nanosecond duration of the dynamic functional stimulation. Although the present disclosure has been illustrated in the context of the dynamic functional test with 1 ns increments over a 40 ns duration, any time increments and durations would also fall within the intended scope of this disclosure. Those skilled in the art will recognize that, not only are the four sample pins 25 data captured, all data (logic states) on every boundary scan register is captured and can be saved.

Those skilled in the art will appreciate that in more real world applications, the digital circuit 21 or unit under test 20 may be virtually probed in isolation, or in conjunction with other digital circuits. For instance, the unit under test may have literally hundreds of input and output pins and as many pins associated with the boundary scan JTAG devices. The present disclosure was illustrated in the context of a unit under test having two JTAG devices in series, but the present disclosure also contemplates any number of JTAG devices in parallel or in series with regard to one or more JTAG interfaces on a single digital circuit 21.

The present description is for illustrative purposes only, and should not be construed to narrow the breadth of the present disclosure in any way. Thus, those skilled in the art will appreciate that various modification might be made to the presently disclosed embodiments without departing from the full and fair scope and spirit of the present disclosure. Other aspects, features and advantages will be apparent upon an examination of the attached drawings and appended claims.

What is claimed is:

1. A digital circuit electronic system comprising:
   a unit under test that includes a digital circuit with at least one boundary scan device in communication with a boundary scan interface, and including a dynamic functional interface, and the boundary scan device includes a plurality of pins;
   at least one piece of electronic equipment in communication with the boundary scan interface and the dynamic functional interface;
   wherein the at least one piece of electronic equipment has a boundary scan algorithm configured to emulate a boundary scan controller, a dynamic functional stimulus algorithm, a synchronizing algorithm and a virtual probe data algorithm;
   wherein the dynamic functional stimulus algorithm is configured to communicate a plurality of vectors to the dynamic functional interface, and the plurality of vectors change during a dynamic functional stimulation;
   wherein the synchronizing algorithm is configured to trigger a boundary scan SAMPLE command from the boundary scan controller to the boundary scan interface at a predetermined timing during the dynamic functional stimulation by controlling a timing of a boundary scan TCK rising clock edge, and boundary scan SAMPLE data is captured responsive to the boundary scan SAMPLE command;
   wherein the virtual probe data algorithm is configured to shift out the captured boundary scan SAMPLE data to the boundary scan interface and store the boundary scan SAMPLE data, which includes logic states of the pins at the predetermined timing during the dynamic functional stimulation;
   wherein the at least one piece of electronic equipment includes a sequencing algorithm configured to repeat the dynamic functional stimulation a plurality of times, and change the predetermined timing each time the dynamic functional stimulation is repeated; and
   the virtual probe data algorithm is configured to assemble a sequence database that includes a sequence of the logic states at a sequence of the predetermined timings during the dynamic functional stimulation.

2. The system of claim 1 wherein the at least one piece of electronic equipment includes a display algorithm configured to display a plurality of the logic states in an oscilloscope format.

3. The system of claim 1 wherein the boundary scan controller is configured to program the boundary scan device through the boundary scan interface to perform a boundary scan SAMPLE command prior to initiating the dynamic functional stimulation.

4. The system of claim 1 wherein at least a portion of the pins are physically inaccessible.

5. The system of claim 1 wherein the unit under test includes a plurality of boundary scan devices.

6. The system of claim 1 wherein each of the logic states is one bit.

7. The system of claim 1 wherein the at least one boundary scan device includes a Field Programmable Gate Array (FPGA) device.

8. The system of claim 1 wherein the at least one boundary scan device includes a Ball Grid Array (BGA).

9. A method of virtually probing a unit under test that includes a digital circuit with at least one boundary scan device in communication with a boundary scan interface, and including a dynamic functional interface, and the boundary scan device includes a plurality of pins, and the method comprising:
   performing a dynamic functional stimulation by asserting a plurality of vectors that change during the dynamic functional stimulation to the dynamic functional interface;
   triggering a boundary scan SAMPLE command through the boundary scan interface at a predetermined timing during the dynamic functional stimulation by controlling a timing of a TCK rising dock edge, and boundary scan SAMPLE data is captured responsive to the boundary scan SAMPLE command;
   shifting out the captured boundary scan SAMPLE data to the boundary scan interface, and the boundary scan SAMPLE data includes logic states of the pins at the predetermined timing during the dynamic functional stimulation;
   storing the boundary scan SAMPLE data;
   changing the predetermined timing with each repeat of the performing, triggering, shifting, and storing steps; and
   assembling a sequence database that includes a sequence of the logic states at a sequence of the predetermined timings during the dynamic functional stimulation.

10. The method of claim 9 wherein the sequence of predetermined timings are at one nanosecond intervals.

11. The method of claim 9 including a step of programming the boundary scan device to perform a boundary scan SAMPLE command prior to the step of performing the dynamic functional stimulation.

* * * * *